United States Patent
Yan et al.

(10) Patent No.: US 10,461,386 B2
(45) Date of Patent: Oct. 29, 2019

(54) IMPEDANCE COMPENSATION STRUCTURE FOR BROADBAND NEAR-FIELD MAGNETIC-FIELD PROBE AND ITS CONSTRUCTION METHOD

(71) Applicant: BEIHANG UNIVERSITY, Beijing (CN)

(72) Inventors: Zhaowen Yan, Beijing (CN); Jianwei Wang, Beijing (CN); Wei Zhang, Beijing (CN); Donglin Su, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 172 days.

(21) Appl. No.: 15/482,735

(22) Filed: Apr. 8, 2017

(65) Prior Publication Data

US 2017/0215274 A1    Jul. 27, 2017

(30) Foreign Application Priority Data

Apr. 8, 2016 (CN) .......................... 2016 1 0216818

(51) Int. Cl.
| | |
|---|---|
| *H01P 3/08* | (2006.01) |
| *G01R 29/08* | (2006.01) |
| *H05K 1/02* | (2006.01) |
| *G01R 31/00* | (2006.01) |
| *G06F 17/50* | (2006.01) |

(52) U.S. Cl.
CPC ............ *H01P 3/08* (2013.01); *G01R 29/0878* (2013.01); *G06F 17/50* (2013.01); *H05K 1/0251* (2013.01); *G01R 31/001* (2013.01); *H05K 1/0222* (2013.01)

(58) Field of Classification Search
CPC .................................................. H05K 1/2051
See application file for complete search history.

(56) References Cited

U.S. PATENT DOCUMENTS

| | | | |
|---|---|---|---|
| 2005/0190614 A1* | 9/2005 | Brunette ............. | H05K 1/0222 365/192 |
| 2009/0077523 A1* | 3/2009 | Jiang ................... | G06F 17/5072 716/130 |
| 2010/0134376 A1* | 6/2010 | Margomenos ......... | H01P 5/028 343/848 |
| 2013/0099876 A1* | 4/2013 | Kushta ................... | H01P 1/203 333/134 |
| 2014/0253112 A1* | 9/2014 | Chou ................. | G01R 33/0076 324/244 |

* cited by examiner

*Primary Examiner* — Tung X Nguyen
*Assistant Examiner* — Feba Pothen

(57) ABSTRACT

An impedance compensation structure for a broadband near-field magnetic-field probe, includes: a signal via; and a plurality of grounding vias provided around the signal via to form a coaxial via array; wherein the grounding via and the signal via have an identical size, all distances of each of the plurality of the grounding vias to the signal via are equal, and the plurality of the grounding vias forms a circle centered at the signal via; wherein each of the plurality of the grounding vias is connected with a magnetic field probe top layer shield plane and a magnetic field probe bottom layer shield plane; each of the plurality of the grounding vias keeps in a conducting state from a direct current to a high frequency, in such a manner that impedance matching of the broadband near-field magnetic-field probe is achieved.

12 Claims, 3 Drawing Sheets

IMPEDANCE COMPENSATION STRUCTURE FOR BROADBAND NEAR-FIELD MAGNETIC-FIELD PROBE AND ITS CONSTRUCTION METHOD

CROSS REFERENCE OF RELATED APPLICATION

The present application claims priority under 35 U.S.C. 119(a-d) to CN 201610216818.6, filed Apr. 8, 2016.

BACKGROUND OF THE PRESENT INVENTION

Field of Invention

The present invention relates to an impedance compensation structure for broadband near-field magnetic-field probe and its construction method, which belongs to the technical field of electromagnetic leakage and electromagnetic-field near-field test.

Description of Related Arts

When the internal conductor, i.e., the signal line, of a magnetic field probe passes through a switch layer of a signal via hole, due to the parasitic effect of the signal via hole, the impedance of the signal line is affected, and thereby the high frequency band characteristics of the magnetic field probe are affected. Thus, it is necessary to preset a broadband impedance compensation for the impedance on the position of the via hole, so as to solve the signal integrity problem caused by the sudden change of the impedance and improve the available frequency band of the near-field magnetic-field test probe.

SUMMARY OF THE PRESENT INVENTION

1. Objects of the Invention

Near field scanning is an important means for solving the problems of electromagnetic interference and electromagnetic compatibility. A probe is a key component in near-field scanning. The bandwidth of the electromagnetic field spectrum is wide, which requires the magnetic field probe in test meeting requirements of broadband testing. Maintaining the magnetic field probe having constant impedance in a test band is an important part for realizing the requirement of broadband test. The key to maintaining constant impedance lies in maintaining signal line of the electromagnetic field probe at constant impedance in a wide band. A wide-band micro-near-field magnetic test probe is manufactured by a PCB printed circuit board process and has a frequency band of 300 kHz-20 GHz. A metal back Conductor-backed coplanar waveguide (CB-CPW) core conductor and a strip line serve as a signal line of the electromagnetic field probe. The CB-CPW core conductor and the strip line are connected by the signal via, which leads to impedance mutation, and thereby effecting characteristics of the near-field magnetic field test probe in a high frequency band. In order to solve the impedance changing problems mentioned above, the present invention provides an impedance compensation structure a micro-band near-field magnetic-field test probe and its construction method, which aims at solving the impedance change caused by the signal via, improving the performance of the transmission line and extending working frequency band of the electromagnetic field probe.

2. Technical Solution

In order to achieve the objective, the present invention puts forwards a impedance compensation structure from the viewpoint of analyzing the impedance on the position of the signal via, so as to compensate impedance change of the magnetic field probe in the signal via, and realizing the compensate impedance of the magnetic probe in the wide frequency band.

The present invention provides an impedance compensation structure for broadband near-field magnetic-field probe. The impedance compensation structure is based on a broadband micro-near-field magnetic field test probe, wherein a structure of the test probe at least comprises a miniature coaxial connector and a magnetic field probe body;

wherein the miniature coaxial connector is a SMA joint; wherein the SMA connector is Super SMA connector developed by United States Southwest Microwave, and a specific model is 292-04A-6;

the magnetic field probe body is a four layered circuit board designed and manufactured based on PCB technique of printed circuit board;

the magnetic field probe body comprises the top layer shield plane, the bottom layer shield plane, a first middle layer, a strip line of a second middle layer, a signal via, a short-circuit hole, a coaxial via array around the short-circuit hole, a CB-CPW core conductor, and a barrier type via array on both sides of the CB-CPW core conductor;

the magnetic field probe body is in a T-shaped structure, wherein a convex end is a top end, and the other end is a bottom end; the top end is for detection of a magnetic field signal, and the bottom end is for handhold and installation of a SMA joint; wherein the a T-shaped structure is capable of decreasing a size of the probe body under a premise of convenient installing and installing SMA connector;

the top layer shield plane has a top layer T-shaped gap on a top end thereof, and a bottom end of the top layer shield plane has a top layer rectangular gap; wherein the T-shaped gap is for preventing the top layer shield plane from shielding the magnetic field signal; the top layer rectangular gap is for preventing the CB-CPW core conductor from connecting with the top layer shield plane;

the bottom layer shield plane has a T-shaped gap having an identical shape with the T-shaped gap on the top layer shield plane, so as to present the bottom layer shield plane from shielding the magnetic field signal, and the bottom end of the magnetic field probe has not any gap;

a size of the T-shaped gap determines sensibility and spatial resolution of the magnetic field probe;

the magnetic field probe second middle layer the strip line of the second middle layer is in an L shape, wherein one end of the strip line passes through the short-circuit hole to connect the top layer shield plane and the bottom layer shield plane on the T-shaped gap; the strip line, the top layer T-shaped gap and the bottom layer T-shaped gap form an internal ring, so as to receive magnetic field from outside; the internal ring is covered by the top layer shield plane and the bottom layer shield plane, which is capable of effectively suppressing coupling of the electric field signal, reducing the electric field signals received by the internal loop, so as to improve the sensitivity of the probe on the magnetic signal;

the CB-CPW core conductor is provided in the rectangular gap opened on the top layer shield plane, the top layer shield plane serves as a ground plane of the CB-CPW, the first middle layer serves as a metal back; the CB-CPW core conductor serves as a feeder line, a first end of the CB-CPW core conductor is connected with the SMA joint and a second end of the CB-CPW core conductor is connected with the second end of the strip line by the signal via; the grounding vias symmetrically distributed on both sides of the CB-CPW core conductor are connected with the top layer shield plane and the bottom layer shield plane to form the barrier type via array, so as to prevent the resonance of the magnetic field probe;

the grounding vias around the signal via are connected with the top layer shield plane and the bottom layer shield plane, distances between each of the plurality of the grounding vias and the signal via are equal and are at a range of 0.9-1.3 mm, so as to form the coaxial via array to achieve impedance matching of the broadband probe;

a length of the CB-CPW core conductor is at a range of 5-8 mm, a diameter of the signal via is at a range of 0.2 mm-0.3 mm; horizontal distances between the signal via and periphery of both sides of the magnetic field probe are equal.

Preferably, a diameter of the grounding vias is at a range of 0.2 mm~0.3 mm;

a diameter of the short circuit vias is at a range of 0.2 mm~0.3 mmT;

the broadband is at a range of 300 kHz~20 GHz; and a size of the micro-probe is at a range of Φ50 mm×10 mm~Φ90 mm×20 mm.

The present invention provides an impedance compensation structure for a broadband near-field magnetic-field probe, which is illustrated in detail as follows.

An impedance compensation structure for a broadband near-field magnetic-field probe, comprises: a signal via; and a plurality of grounding vias provided around the signal via to form a coaxial via array; wherein the grounding via and the signal via have an identical size, all distances of each of the plurality of the grounding vias to the signal via are equal, and the plurality of the grounding vias forms a circle centered at the signal via; wherein each of the plurality of the grounding vias is connected with a magnetic field probe top layer shield plane and a magnetic field probe bottom layer shield plane; each of the plurality of the grounding vias keeps in a conducting state from a direct current to a high frequency, in such a manner that impedance matching of the broadband near-field magnetic-field probe is achieved; by regulating distances between each of the plurality of the grounding vias and the signal via and amounts of the plurality of the grounding vias to accomplish impedance changes caused by the signal via, so as to ensure impedance of the magnetic-field probe is continuous.

One of the plurality of the grounding vias and the signal via are a pair of through holes. If four grounding vias are provided around the signal via, four pairs of through holes in tall are obtained; if six grounding vias are provided around the signal via, six pairs of through holes in tall are obtained. The plurality of the grounding vias is connected with the magnetic field probe top layer shield plane and the magnetic field probe bottom layer shield plane; in the actual test, both the magnetic field probe top layer shield plane and the magnetic field probe bottom layer shield plane are connected with the with an external power source to ground; so the grounding via carries electric charge; each of the plurality of the grounding vias forms a capacitance with the signal via, a size of the capacitance is corresponding to a physical dimension of the grounding via and the signal via, and the dielectric constant of a medium; since the size of the grounding vias and the signal via is identical, one pair of through hole can be regarded as a parallel twin-lead; according to micro-wave theory, a value of a pair of through hole capacitance is calculated according to formula of:

$$C = \frac{\pi \square \varepsilon}{\cosh^{-1}\left(\frac{D}{2a}\right)}; \quad (1)$$

wherein ε is a dielectric constant of a medium, D is a distance between each of the plurality of the grounding vias to the signal via; and a is a radius of the plurality of the grounding vias and the signal via.

The plurality of the grounding vias provides a current return path for signals, an inductance circuit is formed between the plurality of the grounding vias and the signal via; wherein a value of a pair of through-hole inductance can be calculated according to formula of:

$$L = \frac{\mu}{\pi}\square\cosh^{-1}\left(\frac{D}{2a}\right); \quad (2)$$

wherein μ is a permeability of the medium.

A characteristic impedance between a pair of through hole is:

Compared with the twin-lead, the plurality of the grounding vias around the coaxial array via are evenly distributed around the signal via; electric charges are evenly distributed on the plurality of the grounding vias; capacitance of the coaxial via array is basically identical to the parallel twin-lead; N (an amount of the grounding vias) of the grounding vias and the signal via form N pairs of in-parallel inductive circuits; a value of an inductance of the coaxial via array is 1/N of the formula (2), and thus a characteristic impedance of the coaxial via array is:

$$z_0 = \frac{1}{\pi}\sqrt{\frac{\mu}{N\varepsilon}}\cosh^{-1}\left(\frac{D}{2a}\right); \quad (4)$$

wherein N is an amount of the plurality of the grounding vias;

wherein characteristic impedance of the coaxial via array represents an impedance on a position of the signal via; and thus a size and amount of the plurality of the grounding vias can be regulated for impedance matching.

A construction method for an impedance compensation structure for a broadband near-field magnetic-field probe, comprises steps of:

step (1): referring to FIG. 1 and FIG. 2, establishing a magnetic field probe model in a CST microwave studio; performing simulation design on the CST microwave studio comprising: simulation algorithm setting, simulation background setting, simulation boundary condition setting, simulation frequency setting and check TDR simulation setting;

step (2): according to characteristics of the magnetic field probe, setting an amount of grounding vias at 6; wherein a radius of the grounding vias is at 0.125 mm which is a minimum permissible radius in machine drilling, a target impedance to be compensated is 50Ω; and a distance between a grounding via and each of a plurality of signal vias is calculated at 0.9 mm according to the formula (4);

step (3): according to calculation result in the step (2), providing 6 grounding vias around the signal via, and a distance between each of the 6 grounding vias to the signal via is 0.9 mm;

step (4): observing TDR simulation result at an end of each simulation, increasing a distance from the grounding via to the signal via if impedance on a position of the signal via is a concave (capacitive); decreasing a distance from the grounding via to the signal via if impedance on a position of the signal via is a convex (inductive); repeatedly regulating an amount of the grounding vias around the signal via, and the distance between the grounding vias and the signal via until the simulation result of the impedance reaches the target impedance.

Beneficial effects of the present invention are as follows.

(1) A coaxial via array formed by the short circuit via and the signal via is provided to achieve broadband impedance compensation.

(2) The impedance change caused by the signal via may be a change in capacitance, i.e., the impedance decreases; and also may be an inductive change, i.e., the impedance increases. Further, due to the limitation of the circuit board structure, for instance, other transmission lines or circuit board exists in a distance near to the signal via, simply regulating the radius of the grounding short circuit via or the center-to-center space between the grounding short circuit via and the signal via is limited. However, based on the impedance compensation of the coaxial via array, the amount of the grounding short circuit via also serves as a factor for regulating the impedance, and successfully overcoming the limitation mentioned above.

(3) Compensation based on the coaxial via array is simple in structure, easy to realize a broadband compensation, easy to grasp and apply by the engineers. Since the compensation based on the coaxial via array only has a few grounding short circuit vias, the processing and designing cost is low and the application and utilization thereof is easy.

These and other objectives, features, and advantages of the present invention will become apparent from the following detailed description, the accompanying drawings, and the appended claims.

BRIEF DESCRIPTION OF THE DRAWINGS

FIG. 2 (b) is a top view of a first middle layer of the broadband near-field magnetic-field probe.

FIG. 2 (c) is a top view of a second middle layer of the broadband near-field magnetic-field probe.

FIG. 2 (d) is a top view of a bottom layer of the broadband near-field magnetic-field probe.

Reference numbers in the Figs: 1—grounding via; 21—barrier type via array; 22—coaxial via array; 23—short-circuiting via; 31—magnetic field probe top layer shield plane; 32—magnetic field probe first middle layer; 33—magnetic field probe strip line; 34—magnetic field probe bottom layer shield plane; 35—magnetic field probe core conductor; top layer rectangular gap; 41—top layer T—shaped gap; 42—bottom layer T-shaped gap; 5—signal via.

DETAILED DESCRIPTION OF THE PREFERRED EMBODIMENT

Combining with the drawings, the impedance compensation structure for a broadband near-field magnetic-field probe and its construction method is further illustrated, wherein the simulation design ideas and processes, the simulation and test results are provided.

A structure broadband near-field probe is provided by the present invention, wherein the impedance compensation structure is based on the broadband near-field magnetic field probe. In order to illustrate the impedance compensation structure of the present invention better, FIG. 1, and FIG. 2 (a)-(d) shows the structure of the body of the magnetic field probe of the present invention.

(1) Impedance Compensation Structure of the Magnetic Field Probe

Figure 3:
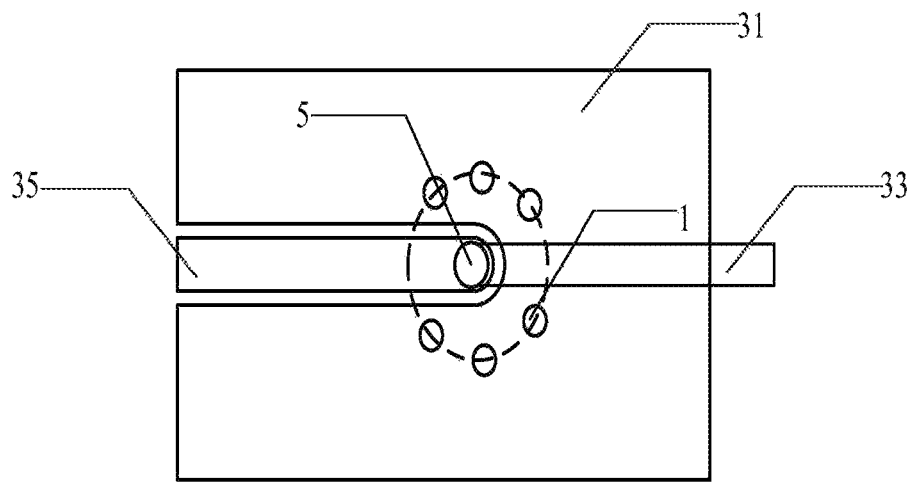
FIG. 3 is a partial top view of a bottom end of a body of a magnetic-field probe comprising a coaxial via array.

As shown in FIG. 3, a magnetic field probe CB-CPW core conductor 35 on a top layer achieves connecting with a magnetic field probe strip line 33 by a signal via 5, and the flow direction of the signal flow changes its layer accordingly. A plurality of grounding vias are provided around the signal via 1. The grounding vias 1 are connected with the magnetic field probe top layer shield plane 31 and the magnetic field probe bottom layer shield plane 34. In a high frequency condition, the grounding vias can be equivalent to an L, C circuit model. Grounding short circuit vias are added around the signal via 5, wherein the signal via 5 and all of the grounding vias form a coaxial via array 22, and the grounding vias change distribution parameters of the signal via 5.

An amount of the grounding vias N is 6, a radius a of the grounding vias is 0.125 mm, a medium is Rogers4350B, a dielectric constant is 3.66; and a distance D between the grounding via 1 and the signal via 5 is preset at 0.9 mm. Calculating according to theories of the formula (2), at the moment characteristic impedance of the coaxial via array is 50Ω. Regulating a size of D appropriately under the premise that both N and a are determined. Ultimately, in the magnetic-field impedance compensation structure, D of the coaxial via array is 1.0 mm.

Figure 4:
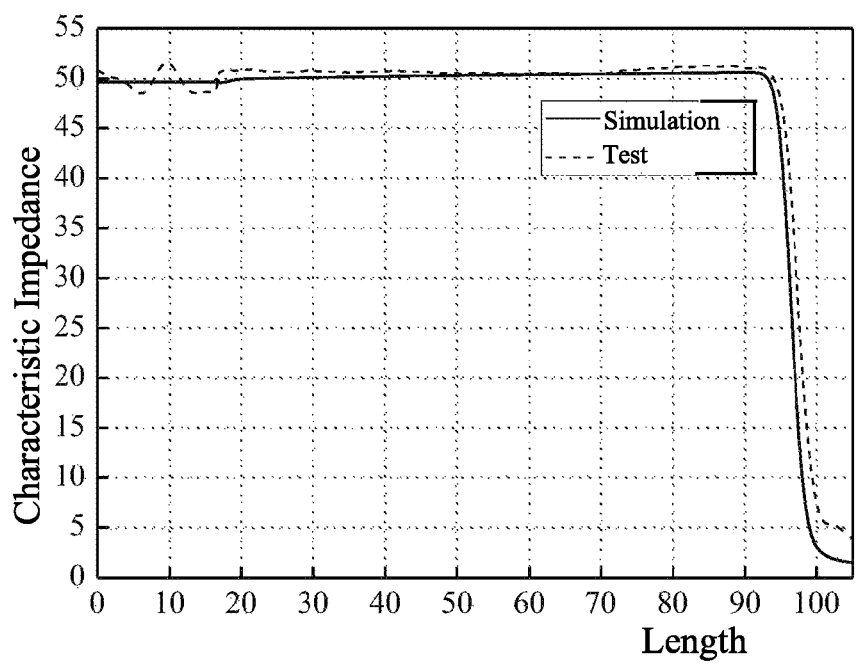
FIG. 4 is a simulation and test chart of the body of the magnetic-field probe with a impedance compensation of the coaxial via array.

The test adopts a function module of a Time-Domain Reflector (TDR) in a E5071C 300 kHz~20 GHz vector network analyzer module from Agilent Technologies Inc, a rise time thereof is 43.8 Ps. The characteristic impedance CST simulation and test result are compared and shown in FIG. 4. A length of an abscissa in FIG. 2 (a)-(d) is corresponding to a total length of the SMA connector and the magnetic field probe body, from the SMA connector to a bottom end of the magnetic field probe, and then to the top end of the magnetic field probe. An internal ring of the top end of the magnetic field is short circuited, and thus the characteristic impedance decreases rapidly at the top end of the magnetic probe end, which is corresponding to a position about 94 mm in the abscissa in the FIG. 4).

Figure 5:
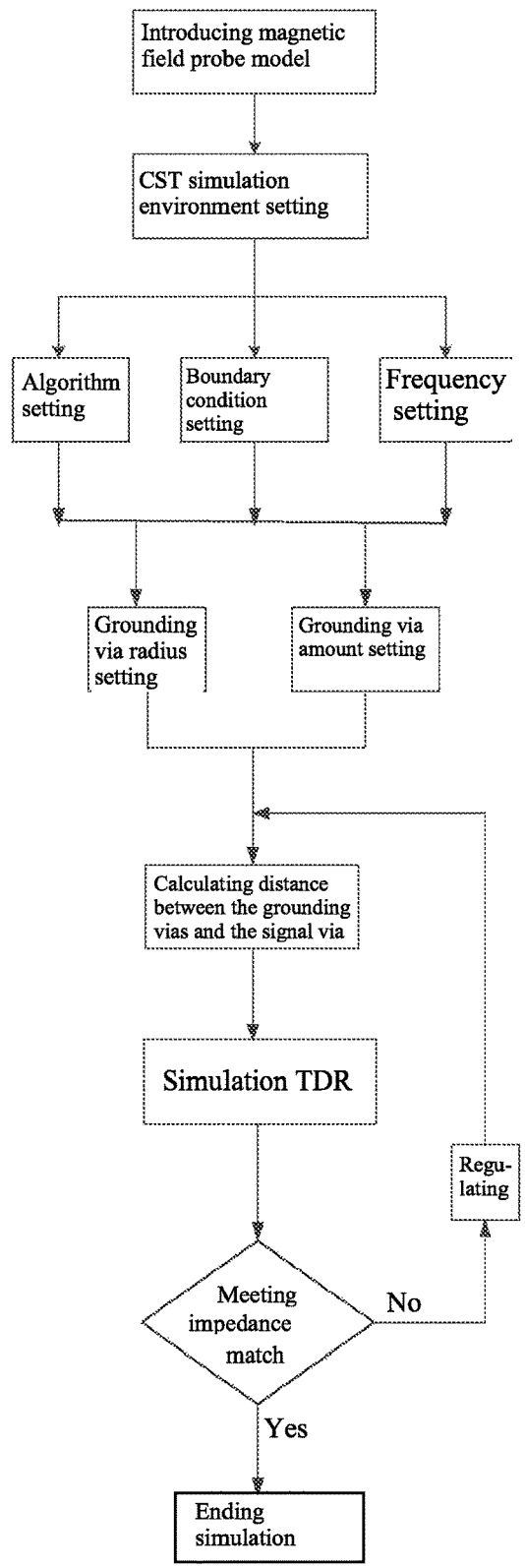
FIG. 5 is a flow chart of a construction method of a impedance compensation structure of the magnetic field probe.

(2) Construction Method of the Magnetic Field Probe Impedance Compensation Structure FIG. 5 is a flow chart of the construction method of the magnetic field probe compensation structure. Steps of the construction method of the magnetic field probe impedance compensation structure are illustrated in detail as follows.

Figure 1:
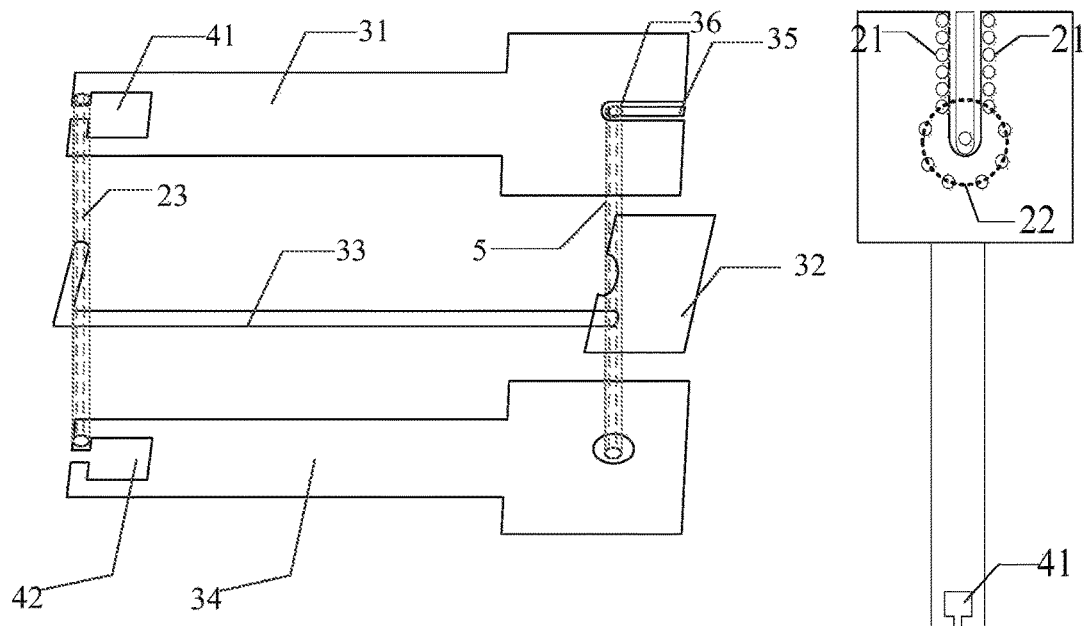
FIG. 1 is a three-dimensional structure expansion diagram of a body of a broadband near-field magnetic-field probe.
Figure 2B:
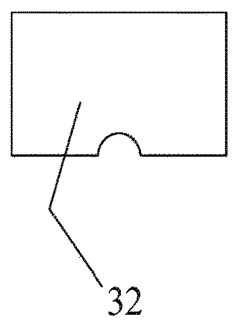
FIG. 2 (a) is a top view of a top layer of the broadband near-field magnetic-field probe.
Figure 2C:
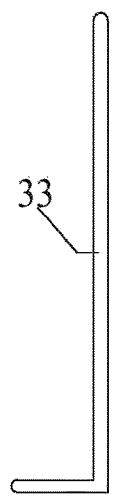
Figure 2D:
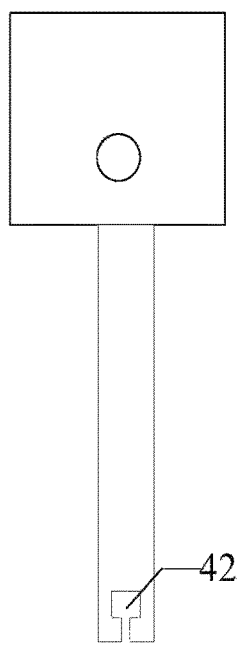

Step (1): establishing a CST simulation model in a CST microwave studio according to FIG. 1 and FIG. 2 (a)-(d), wherein a coaxial via array is not included; setting CST microwave studio algorithm to be a time domain simulation; a boundary condition is electric; wherein the boundary condition of the Electric makes the simulation with a good convergence; although the lower limit frequency of the magnetic field probe is design at 300 kHz, the lower limit frequency of the simulation is designed at 0 GHz, which is capable of accelerating process of the simulation, so the simulation frequency is 0-20 GHz, the simulation background is set to "Normal", the background meaning is set to vacuum, which is similar to air in the actual environment; TDR Analysis is checked in simulation setting.

Step (2): according to the structural characteristics of the magnetic field probe body, providing 6 grounding vias; for simplifying machining process, a radius of the grounding vias 1 forming the coaxial via array adopts an identical size with other vias, the radius of the grounding vias is set to 0.125 mm; and calculating according to the formula (4) the distance between each of the grounding vias 1 and the signal via 5 is about 0.9 mm.

Step (3): according to calculation result in the step (2), providing 6 grounding vias around the signal via, and a distance between each of the 6 grounding vias to the signal via is 0.9 mm; the 6 grounding vias 1 are approximately distributed evenly on a circle with a center of the signal via 5 and a radius of 0.9 mm.

Step (4): observing TDR simulation result at an end of each simulation, increasing D if impedance on a position of the signal via 5 is a concave (capacitive); decreasing D if impedance on a position of the signal via is a convex (inductive); repeatedly regulating an amount of the grounding vias around the signal via until the impedance is matched; wherein in the present invention, D is calculated according to the formula, the simulation result shows that the impedance on the signal via 5 is a concave, so D is increased; and after repeatedly optimizing, the value of D is finally set to 1.0 mm.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles, e.g., impedance compensation of via on important signal line in a high speed PCB board design. Therefore, this invention includes all modifications encompassed within the spirit and scope of the following claims.

What is claimed is:

1. An impedance compensation structure for a broadband near-field magnetic-field probe, comprising: a signal via; and a plurality of grounding vias provided around the signal via to form a coaxial via array; wherein the plurality of grounding vias and the signal via have an identical size, all distances between each of the plurality of the grounding vias and the signal via are equal, and the plurality of the grounding vias forms a circle centered at the signal via; wherein each of the plurality of the grounding vias is connected with a magnetic field probe top layer shield plane and a magnetic field probe bottom layer shield plane; each of the plurality of the grounding vias keeps in a conducting state from a direct current to a high frequency, in such a manner that impedance matching of the broadband near-field magnetic-field probe is achieved; by regulating distances between each of the plurality of the grounding vias and the signal via and amounts of the plurality of the grounding vias to accomplish impedance changes caused by the signal via, so as to ensure impedance of the magnetic-field probe is continuous;

wherein one of the plurality of the grounding vias and the signal via are a pair of through holes;

wherein the plurality of the grounding vias is connected with the magnetic field probe top layer shield plane and the magnetic field probe bottom layer shield plane; both the magnetic field probe top layer shield plane and the magnetic field probe bottom layer shield plane are connected with the with an external power source to ground; each of the plurality of the grounding vias forms a capacitance with the signal via, wherein a value of a pair of through hole capacitance is calculated according to formula of:

$$C = \frac{\pi \square \varepsilon}{\cosh^{-1}\left(\frac{D}{2a}\right)}; \qquad (1)$$

wherein ε is a dielectric constant of a first medium, D is a distance between each of the plurality of the grounding vias to the signal via; and a is a radius of the plurality of the grounding vias and the signal via.

2. The impedance compensation structure for the broadband near-field magnetic-field probe, as recited in claim 1, wherein the plurality of the grounding vias provides a current return path for signals, an inductance circuit is formed between the plurality of the grounding vias and the signal via; wherein a value of a pair of through-hole inductance is calculated according to formula of:

$$L = \frac{\mu}{\pi} \square \cosh^{-1}\left(\frac{D}{2a}\right); \qquad (2)$$

wherein μ is a permeability of a second medium.

3. The impedance compensation structure for the broadband near-field magnetic-field probe, as recited in claim 1, wherein the plurality of the grounding vias provides a current return path for signals, an inductance circuit is formed between the plurality of the grounding vias and the signal via; wherein a value of a pair of through-hole inductance is calculated according to formula of:

$$L = \frac{\mu}{\pi} \square \cosh^{-1}\left(\frac{D}{2a}\right); \qquad (2)$$

wherein μ is a permeability of a second medium.

4. The impedance compensation structure for the broadband near-field magnetic-field probe, as recited in claim 1, wherein the plurality of the grounding vias provides a current return path for signals, an inductance circuit is formed between the plurality of the grounding vias and the signal via; wherein a value of a pair of through-hole inductance is calculated according to formula of:

$$L = \frac{\mu}{\pi} \square \cosh^{-1}\left(\frac{D}{2a}\right); \qquad (2)$$

wherein μ is a permeability of a second medium.

5. The impedance compensation structure for the broadband near-field magnetic-field probe, as recited in claim 2, wherein a characteristic impedance between a pair of through hole is:

$$z = \sqrt{\frac{L}{C}}. \quad (3)$$

6. The impedance compensation structure for the broadband near-field magnetic-field probe, as recited in claim 3, wherein a characteristic impedance between a pair of through hole is:

$$z = \sqrt{\frac{L}{C}}. \quad (3)$$

7. The impedance compensation structure for the broadband near-field magnetic-field probe, as recited in claim 4, wherein a characteristic impedance between a pair of through hole is:

$$z = \sqrt{\frac{L}{C}}. \quad (3)$$

8. The impedance compensation structure for the broadband near-field magnetic-field probe, as recited in claim 2, wherein the plurality of the grounding vias around the coaxial array via are evenly distributed around the signal via; electric charges are evenly distributed on the plurality of the grounding vias; a capacitance of the coaxial via array is identical to a twin-lead; the plurality of the grounding vias and the signal via form N pairs of in-parallel inductive circuits; a value of an inductance of the coaxial via array is 1/N of the formula (2), and thus a characteristic impedance of the coaxial via array is:

$$z_0 = \frac{1}{\pi}\sqrt{\frac{\mu}{N\varepsilon}}\cosh^{-1}\left(\frac{D}{2a}\right); \quad (4)$$

wherein N is an amount of the plurality of the grounding vias;

wherein the characteristic impedance of the coaxial via array represents an impedance on a position of the signal via; and thus a size and amount of the plurality of the grounding vias are regulated for impedance matching.

9. The impedance compensation structure for the broadband near-field magnetic-field probe, as recited in claim 1, further comprising a miniature coaxial connector and a magnetic field probe body;

wherein the miniature coaxial connector is a SMA joint;
the magnetic field probe body is a four layered circuit board designed and manufactured based on PCB technique of printed circuit board;
the magnetic field probe body comprises the top layer shield plane, the bottom layer shield plane, a first middle layer, a strip line of a second middle layer, a signal via, a short-circuit hole, a coaxial via array around the short-circuit hole, a CB-CPW core conductor, and a barrier type via array on both sides of the CB-CPW core conductor;
the magnetic field probe body is in a T-shaped structure, wherein a convex end is a top end, and the other end is a bottom end; the top end is for detection of a magnetic field signal, and the bottom end is for handhold and installation of a SMA joint;
the top layer shield plane has a top layer T-shaped gap on a top end thereof, and a bottom end of the top layer shield plane has a top layer rectangular gap; wherein the T-shaped gap is for preventing the top layer shield plane from shielding the magnetic field signal; the top layer rectangular gap is for preventing the CB-CPW core conductor from connecting with the top layer shield plane;
the bottom layer shield plane has a T-shaped gap having an identical shape with the T-shaped gap on the top layer shield plane, so as to present the bottom layer shield plane from shielding the magnetic field signal, and the bottom end of the magnetic field probe has not any gap;
a size of the T-shaped gap determines sensibility and spatial resolution of the magnetic field probe;
the magnetic field probe second middle layer
the strip line of the second middle layer is in an L shape, wherein one end of the strip line passes through the short-circuit hole to connect the top layer shield plane and the bottom layer shield plane on the T-shaped gap; the strip line, the top layer T-shaped gap and the bottom layer T-shaped gap form an internal ring, so as to receive magnetic field from outside; the internal ring is covered by the top layer shield plane and the bottom layer shield plane;
the CB-CPW core conductor is provided in the rectangular gap opened on the top layer shield plane, the top layer shield plane serves as a ground plane of the CB-CPW, the first middle layer serves as a metal back; the CB-CPW core conductor serves as a feeder line, a first end of the CB-CPW core conductor is connected with the SMA joint and a second end of the CB-CPW core conductor is connected with the second end of the strip line by the signal via; the grounding vias symmetrically distributed on both sides of the CB-CPW core conductor are connected with the top layer shield plane and the bottom layer shield plane to form the barrier type via array, so as to prevent the resonance of the magnetic field probe;
the grounding vias around the signal via are connected with the top layer shield plane and the bottom layer shield plane, distances between each of the plurality of the grounding vias and the signal via are equal and are at a range of 0.9-1.3 mm, so as to form the coaxial via array to achieve impedance matching of the broadband probe;
a length of the CB-CPW core conductor is at a range of 5-8 mm, a diameter of the signal via is at a range of 0.2 mm-0.3 mm; horizontal distances between the signal via and periphery of both sides of the magnetic field probe are equal.

10. A construction method for an impedance compensation structure for a broadband near-field magnetic-field probe, comprising steps of:

step (1): establishing a magnetic field probe model in a CST microwave studio; performing simulation design on the CST microwave studio comprising: simulation algorithm setting, simulation background setting, simulation boundary condition setting, simulation frequency setting and check TDR simulation setting;

step (2): according to characteristics of the magnetic field probe, setting an amount of grounding vias at 6; wherein a radius of the grounding vias is at 0.125 mm which is a minimum permissible radius in machine drilling, a target impedance to be compensated is 50Ω; and a distance between a grounding via and each of a plurality of signal vias is calculated at 0.9 mm according to a formula $$z_0 = \frac{1}{\pi}\sqrt{\frac{\mu}{N\varepsilon}} \cosh^{-1}(D/2a);$$

step (3): according to calculation result in the step (2), providing 6 grounding vias around the signal via, and a distance between each of the 6 grounding vias to the signal via is 0.9 mm;

step (4): observing TDR simulation result at an end of each simulation, increasing a distance from the grounding via to the signal via if impedance on a position of the signal via is a concave; decreasing a distance from the grounding via to the signal via if impedance on a position of the signal via is a convex; repeatedly regulating an amount of the grounding vias around the signal via, and the distance between the grounding vias and the signal via until the simulation result of the impedance reaches the target impedance.

11. The construction method for the impedance compensation structure for the broadband near-field magnetic-field probe, as recited in claim 10, wherein in the step (1), the simulation algorithm is a time domain simulation; simulation background is Normal, meaning is vacuum, simulation boundary condition is electric wall, simulation frequency is at a range of 0-20 GHz, TDR Analysis IS checked.

12. The construction method for the impedance compensation structure for the broadband near-field magnetic-field probe, as recited in claim 10, wherein the broadband near-field magnetic-field probe comprises a miniature coaxial connector and a magnetic field probe body;

wherein the miniature coaxial connector is a SMA joint;

the magnetic field probe body is a four layered circuit board designed and manufactured based on PCB technique of printed circuit board;

the magnetic field probe body comprises the top layer shield plane, the bottom layer shield plane, a first middle layer, a strip line of a second middle layer, a signal via, a short-circuit hole, a coaxial via array around the short-circuit hole, a CB-CPW core conductor, and a barrier type via array on both sides of the CB-CPW core conductor;

the magnetic field probe body is in a T-shaped structure, wherein a convex end is a top end, and the other end is a bottom end; the top end is for detection of a magnetic field signal, and the bottom end is for handhold and installation of a SMA joint;

the top layer shield plane has a top layer T-shaped gap on a top end thereof, and a bottom end of the top layer shield plane has a top layer rectangular gap; wherein the T-shaped gap is for preventing the top layer shield plane from shielding the magnetic field signal; the top layer rectangular gap is for preventing the CB-CPW core conductor from connecting with the top layer shield plane;

the bottom layer shield plane has a T-shaped gap having an identical shape with the T-shaped gap on the top layer shield plane, so as to present the bottom layer shield plane from shielding the magnetic field signal, and the bottom end of the magnetic field probe has not any gap;

a size of the T-shaped gap determines sensibility and spatial resolution of the magnetic field probe;

the magnetic field probe second middle layer the strip line of the second middle layer is in an L shape, wherein one end of the strip line passes through the short-circuit hole to connect the top layer shield plane and the bottom layer shield plane on the T-shaped gap; the strip line, the top layer T-shaped gap and the bottom layer T-shaped gap form an internal ring, so as to receive magnetic field from outside; the internal ring is covered by the top layer shield plane and the bottom layer shield plane;

the CB-CPW core conductor is provided in the rectangular gap opened on the top layer shield plane, the top layer shield plane serves as a ground plane of the CB-CPW, the first middle layer serves as a metal back; the CB-CPW core conductor serves as a feeder line, a first end of the CB-CPW core conductor is connected with the SMA joint and a second end of the CB-CPW core conductor is connected with the second end of the strip line by the signal via; the grounding vias symmetrically distributed on both sides of the CB-CPW core conductor are connected with the top layer shield plane and the bottom layer shield plane to form the barrier type via array, so as to prevent the resonance of the magnetic field probe;

the grounding vias around the signal via are connected with the top layer shield plane and the bottom layer shield plane, distances between each of the plurality of the grounding vias and the signal via are equal and are at a range of 0.9-1.3 mm, so as to form the coaxial via array to achieve impedance matching of the broadband probe;

a length of the CB-CPW core conductor is at a range of 5-8 mm, a diameter of the signal via is at a range of 0.2 mm-0.3 mm; horizontal distances between the signal via and periphery of both sides of the magnetic field probe are equal.

* * * * *